United States Patent
Takama

(10) Patent No.: US 11,357,148 B2
(45) Date of Patent: Jun. 7, 2022

(54) COMPONENT MOUNTING DEVICE

(71) Applicant: YAMAHA HATSUDOKI KABUSHIKI KAISHA, Iwata (JP)

(72) Inventor: Kazushi Takama, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 392 days.

(21) Appl. No.: 15/757,964

(22) PCT Filed: Oct. 15, 2015

(86) PCT No.: PCT/JP2015/079135
§ 371 (c)(1),
(2) Date: Mar. 6, 2018

(87) PCT Pub. No.: WO2017/064786
PCT Pub. Date: Apr. 20, 2017

(65) Prior Publication Data
US 2018/0206370 A1    Jul. 19, 2018

(51) Int. Cl.
*H05K 13/04* (2006.01)
*G01N 21/956* (2006.01)
*H05K 13/08* (2006.01)

(52) U.S. Cl.
CPC ... *H05K 13/0452* (2013.01); *G01N 21/95684* (2013.01); *H05K 13/081* (2018.08); *H05K 13/085* (2018.08); *H05K 13/0812* (2018.08)

(58) Field of Classification Search
CPC .............. H05K 13/0452; H05K 13/085; H05K 13/081; H05K 13/0812
See application file for complete search history.

(56) References Cited

U.S. PATENT DOCUMENTS

| | | | | |
|---|---|---|---|---|
| 5,200,799 | A * | 4/1993 | Maruyama | G01R 31/309 250/235 |
| 6,317,972 | B1 * | 11/2001 | Asai | H05K 13/0812 29/833 |
| 7,539,339 | B2 * | 5/2009 | Tanabe | G06K 9/32 382/146 |
| 10,621,745 | B2 * | 4/2020 | Takama | H05K 13/0815 |

(Continued)

FOREIGN PATENT DOCUMENTS

| JP | H05-198999 A | 8/1993 |
|---|---|---|
| JP | 2007-511094 A | 4/2007 |

(Continued)

OTHER PUBLICATIONS

An Office Action; "Decision of Refusal," issued by the Japanese Patent Office dated Feb. 5, 2019, which corresponds to Japanese Patent Application No. 2017-545047 and is related to U.S. Appl. No. 15/757,964; with English language translation.

(Continued)

*Primary Examiner* — Jeffrey T Carley
(74) *Attorney, Agent, or Firm* — Studebaker & Brackett PC

(57) ABSTRACT

A component mounting device includes a mounting head that mounts a component at a mounting position on a substrate, and a control unit that determines a mounting state of another component mounted in advance around the mounting position based on height information of a region around the mounting position.

1 Claim, 7 Drawing Sheets

(56) References Cited

U.S. PATENT DOCUMENTS

| | | | | |
|---|---|---|---|---|
| 2003/0029032 A1* | 2/2003 | Haji | ............... | H01L 21/67144 |
| | | | | 29/832 |
| 2003/0093896 A1* | 5/2003 | Usui | ............... | H05K 13/0812 |
| | | | | 29/743 |
| 2003/0096437 A1* | 5/2003 | Oh | ............... | G01N 21/95684 |
| | | | | 438/14 |
| 2003/0110610 A1* | 6/2003 | Duquette | ........... | H05K 13/0818 |
| | | | | 29/407.09 |
| 2007/0116351 A1* | 5/2007 | Duquette | ............. | H04N 13/254 |
| | | | | 382/151 |
| 2013/0107033 A1* | 5/2013 | Kido | ................. | H05K 13/0812 |
| | | | | 348/86 |
| 2013/0279655 A1* | 10/2013 | Ookawa | ............. | H05K 13/0815 |
| | | | | 378/62 |
| 2015/0026974 A1* | 1/2015 | Hachiya | ................. | H05K 3/30 |
| | | | | 29/833 |
| 2015/0204801 A1* | 7/2015 | Itou | ...................... | H05K 13/082 |
| | | | | 378/63 |
| 2017/0013750 A1* | 1/2017 | Ohnishi | ............. | H05K 13/0404 |

FOREIGN PATENT DOCUMENTS

| | | |
|---|---|---|
| JP | 2007-214460 A | 8/2007 |
| JP | 2008-098411 A | 4/2008 |
| JP | 2008-103426 A | 5/2008 |
| JP | 2008-516453 A | 5/2008 |
| JP | 2013-045873 A | 3/2013 |
| JP | 2014-093390 | 5/2014 |
| JP | 2014-216621 | 11/2014 |
| JP | 2015-079933 A | 4/2015 |

OTHER PUBLICATIONS

An Office Action issued by the Japanese Patent Office dated Oct. 23, 2018, which corresponds to Japanese Patent Application No. 2017-545047 and is related to U.S. Appl. No. 15/757,964.
International Search Report issued in PCT/JP2015/079135; dated Dec. 22, 2015.
Written Opinion issued in PCT/JP2015/079135; dated Dec. 22, 2015.
An Office Action mailed by the State Intellectual Property Office of the People's Republic of China dated Aug. 5, 2019, which corresponds to Chinese Patent Application No. 201580082290.1 and is related to U.S. Appl. No. 15/757,964.

\* cited by examiner

DURING SUCTION OF COMPONENT

DURING MOUNTING OF COMPONENT

MEASUREMENT OF SUBSTRATE SURFACE HEIGHT

COMPONENT MOUNTING DEVICE

CROSS-REFERENCE TO RELATED APPLICATION

This application is a National Stage of International Patent Application No. PCT/JP2015/079135, filed Oct. 15, 2015, the entire content of which is incorporated herein by reference.

BACKGROUND

Technical Field

The present disclosure relates to a component mounting device.

Background Art

In general, a component mounting device is known. A component mounting device is disclosed in Japanese Patent Laying-Open No. 2008-098411, for example.

The aforementioned Japanese Patent Laying-Open No. 2008-098411 discloses a surface mounter (component mounting device) including a suction mounting head that mounts a component at a mounting position on a substrate and a camera capable of imaging the mounting position on the substrate. In this surface mounter, it is determined whether or not each component is mounted on the substrate based on an image captured at the time of mounting.

SUMMARY

However, in the surface mounter disclosed in the aforementioned Japanese Patent Laying-Open No. 2008-098411, it is determined whether or not each component is mounted on the substrate based on the image captured at the time of mounting, and hence defective mounting due to an operation of mounting another component cannot inconveniently be detected when the same occurs after mounting. Therefore, there is such a problem that it is difficult to immediately detect defective component mounting around the mounted component.

The present disclosure has been proposed in order to solve the aforementioned problem, and provides a component mounting device capable of immediately detecting defective mounting of a component on a substrate around a mounted component.

A component mounting device according to a first aspect of the present disclosure includes a mounting head that mounts a component at a mounting position on a substrate and a control unit that determines a mounting state of another component mounted in advance around the mounting position based on height information of a region around the mounting position.

The component mounting device according to the first aspect of the present disclosure includes the control unit that performs control as described above such that defective mounting of another component mounted in advance on the substrate can be detected when another component mounted in advance moves due to the mounting operation at the time of mounting the component. Consequently, unlike the case where the mounting state is determined by a downstream inspection device or the like after all components are mounted on the substrate, defective mounting of the component on the substrate around the mounted component can be immediately detected. Thus, an error can be detected immediately after defective mounting of the component around the mounted component occurs, and hence the cause of the defective mounting can be easily identified.

A component mounting device according to a second aspect of the present disclosure includes a mounting head that mounts a component at a mounting position on a substrate and a control unit that determines whether or not there is a blow-off of another component mounted in advance around the mounting position based on an amount of change in an image of a region around the mounting position captured before and after mounting of the component.

The component mounting device according to the second aspect of the present disclosure includes the control unit that performs control as described above such that defective mounting of another component mounted in advance on the substrate can be detected when another component mounted in advance moves due to the mounting operation at the time of mounting the component. Consequently, unlike the case where the mounting state is determined by a downstream inspection device or the like after all components are mounted on the substrate, defective mounting of the component on the substrate around the mounted component can be immediately detected. Thus, an error can be detected immediately after defective mounting of the component around the mounted component occurs, and hence the cause of the defective mounting can be easily identified.

The aforementioned component mounting device according to the first and second aspects preferably further includes an imaging portion capable of imaging the region around the mounting position from a plurality of directions, and the control unit is preferably configured to acquire the height information of the region around the mounting position or the image of the region around the mounting position based on an imaging result of the imaging portion. According to this structure, when the height information of the mounting position of the component is acquired based on the images captured from the plurality of directions, the positional deviation of the component at the mounting position in the captured image can be accurately acquired based on the actual height information of the mounting position of the component. In addition, also when the image of the region around the mounting position is acquired based on the images captured from the plurality of directions, the information of the region around the mounting position in the captured image can be accurately acquired. Consequently, defective mounting of the component on the substrate around the mounted component can be more accurately detected.

In this case, the imaging portion preferably includes a plurality of cameras, or a single camera and an optical system that divides a field of view of the single camera. According to this structure, the mounting position on the substrate can be easily imaged from the plurality of directions by the plurality of cameras or the optical system that divides the field of view of the single camera.

The aforementioned component mounting device according to the second aspect preferably further includes an imaging portion capable of imaging the region around the mounting position, and the control unit is preferably configured to determine whether or not there is a blow-off of another component mounted in advance in a vicinity of the mounting position based on an amount of change in an image of the vicinity of the mounting position captured by the imaging portion before and after mounting of the component. According to this structure, the component to be mounted and another component mounted in advance in the vicinity of the mounting position can be captured in the same image, and hence a mounting determination for the component and a blow-off determination for another component mounted in advance in the vicinity of the mounting position can be made with the same imaging.

In this case, the imaging portion is preferably configured to capture an image before mounting of the component when the mounting head moves down to the mounting position on the substrate before mounting of the component and to capture an image after mounting of the component when the mounting head moves up from the mounting position on the substrate after mounting of the component, and the control unit is preferably configured to determine whether or not there is the blow-off of the another component mounted in advance in the vicinity of the mounting position by comparing the image before mounting and the image after mounting. According to this structure, the image before mounting and the image after mounting, which are captured immediately before and after mounting, are compared, and hence it is not necessary to provide a storage unit that stores image data for the mounting positions of a plurality of components. Furthermore, imaging is performed during downward movement and upward movement of the mounting head, and hence as compared with the case where the downward/upward movement of the mounting head and the imaging operation are separately performed, it is possible to prevent the time separately and additionally required for the imaging operation.

In the aforementioned component mounting device according to the first aspect, the control unit is preferably configured to determine whether or not there is a blow-off of the another component mounted in advance around the mounting position based on the height information of the region around the mounting position. According to this structure, defective mounting of the component on the substrate around the mounted component can be accurately detected based on the height information of the region around the mounting position.

In this case, the control unit is preferably configured to determine whether or not there is the blow-off of the another component mounted in advance around the mounting position based on an amount of change in the height information of the region around the mounting position before and after mounting of the component. According to this structure, the determination is made based on the change in the height information of the region around the mounting position such that the influence of warpage of the substrate, for example, is significantly reduced or prevented, and hence defective mounting of the component on the substrate around the mounted component can be more accurately detected.

According to the present disclosure, as hereinabove described, the component mounting device capable of immediately detecting defective mounting of the component on the substrate around the mounted component can be provided.

DETAILED DESCRIPTION

An embodiment embodying the present disclosure is hereinafter described on the basis of the drawings.

(Structure of Component Mounting Device)

The structure of a component mounting device 100 according to the embodiment of the present disclosure is now described with reference to FIG. 1.

Figure 1:
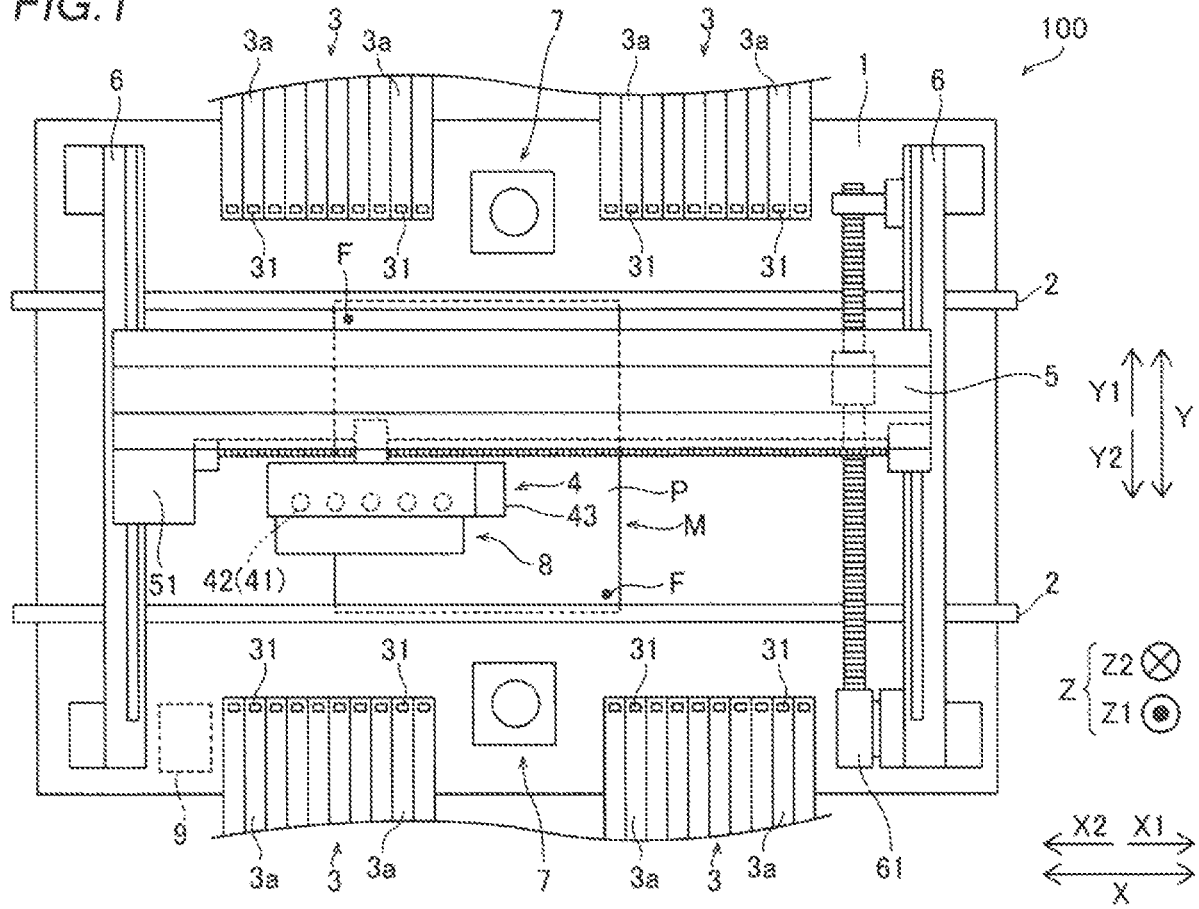
FIG. 1 is a diagram showing the overall structure of a component mounting device according to an embodiment of the present disclosure.

As shown in FIG. 1, the component mounting device 100 is a component mounting device that conveys a substrate P in a direction X by a pair of conveyors 2 and mounts components 31 on the substrate P at a mounting operation position M. The component mounting device 100 includes a base 1, the pair of conveyors 2, component feeders 3, a head unit 4, a support 5, a pair of rails 6, component recognition imaging portions 7, an imaging unit 8, and a control unit 9. The imaging unit 8 is an example of an "imaging portion" in the claims.

The pair of conveyors 2 are installed on the base 1 and are configured to convey the substrate P in the direction X. In addition, the pair of conveyors 2 are configured to hold the substrate P being conveyed in a stopped state at the mounting operation position M. Moreover, the pair of conveyors 2 are configured such that an interval therebetween in a direction Y can be adjusted according to the dimensions of the substrate P.

The component feeders 3 are disposed outside (Y1 and Y2 sides) of the pair of conveyors 2. A plurality of tape feeders 3a are disposed in the component feeders 3.

The tape feeders 3a hold reels (not shown) on which tapes that hold a plurality of components 31 at a predetermined interval are wound. The tape feeders 3a are configured to feed the components 31 from the tips of the tape feeders 3a by rotating the reels to feed the tapes that hold the components 31. The components 31 include electronic components such as ICs, transistors, capacitors, and resistors.

The head unit 4 is disposed above the pair of conveyors 2 and the component feeders 3, and includes a plurality of (five) mounting heads 42 including nozzles 41 (see FIG. 2) mounted at their lower ends and a substrate recognition camera 43. The mounting heads 42 are configured to be movable up and down (movable in a direction Z), and are configured to suction and hold the components 31 fed from the tape feeders 3a by a negative pressure generated at the tips of the nozzles 41 by a negative pressure generator (not shown) and to mount the components 31 at mounting positions on the substrate P.

The substrate recognition camera 43 is configured to image fiducial marks F of the substrate P in order to recognize the position of the substrate P. The positions of the fiducial marks F are imaged and recognized such that the mounting positions of the components 31 on the substrate P can be accurately acquired.

The support 5 includes a motor 51. The support 5 is configured to move the head unit 4 in the direction X along the support 5 by driving the motor 51. Both ends of the support 5 are supported by the pair of rails 6.

The pair of rails 6 are fixed on the base 1. A rail 6 on an X1 side includes a motor 61. The rails 6 are configured to move the support 5 in the direction Y perpendicular to the direction X along the pair of rails 6 by driving the motor 61. The head unit 4 is movable in the direction X along the support 5, and the support 5 is movable in the direction Y along the rails 6 such that the head unit 4 is movable in the directions X and Y.

The component recognition imaging portions 7 are fixed on the upper surface of the base 1. The component recognition imaging portions 7 are disposed outside (Y1 and Y2 sides) of the pair of conveyors 2. The component recognition imaging portions 7 are configured to image the components 31 suctioned by the nozzles 41 of the mounting heads 42 from the lower side (Z2 side) in order to recognize the suction states (suction attitudes) of the components 31 prior to mounting of the components 31. Thus, the control unit 9 can acquire the suction states of the components 31 suctioned by the nozzles 41 of the mounting heads 42.

Figure 2:
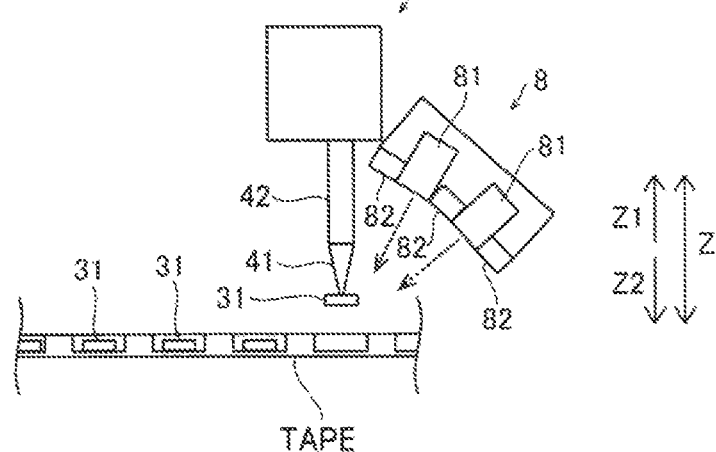
FIG. 2 is a side elevational view of a head unit of the component mounting device according to the embodiment of the present disclosure during suction of a component.
Figure 3:
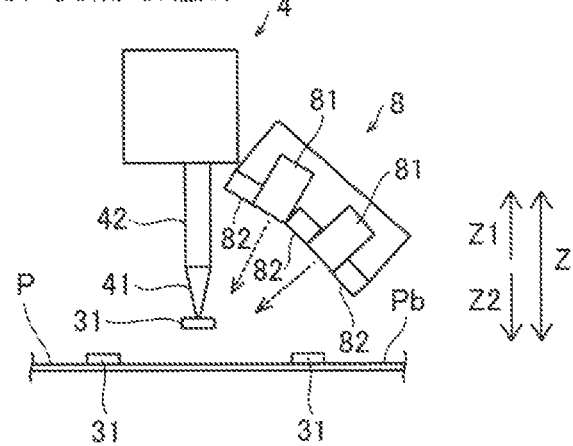
FIG. 3 is a side elevational view of the head unit of the component mounting device according to the embodiment of the present disclosure during mounting of the component.

The imaging unit 8 is mounted on the head unit 4. Thus, the imaging unit 8 is configured to move in the directions X and Y together with the head unit 4 as the head unit 4 moves in the directions X and Y. Furthermore, the imaging unit 8 is configured to capture images of the mounting positions and regions around the mounting positions before and after mounting in order for the control unit 9 to make a determination (mounting determination) of whether or not the components 31 have been normally mounted at the mounting positions and a determination of the mounting states of the components 31 around the mounting positions. The imaging unit 8 is also configured to capture images for measuring the heights of the mounting positions on the substrate P. In addition, the imaging unit 8 is configured to capture images of the components 31 mounted on the substrate P and images for measuring the heights of solders on the substrate P. As shown in FIGS. 2 and 3, the imaging unit 8 includes a plurality of cameras 81 and illuminators 82. Thus, the imaging unit 8 can image the mounting positions and the regions around the mounting positions on the substrate P from a plurality of directions (angles).

Figure 5:
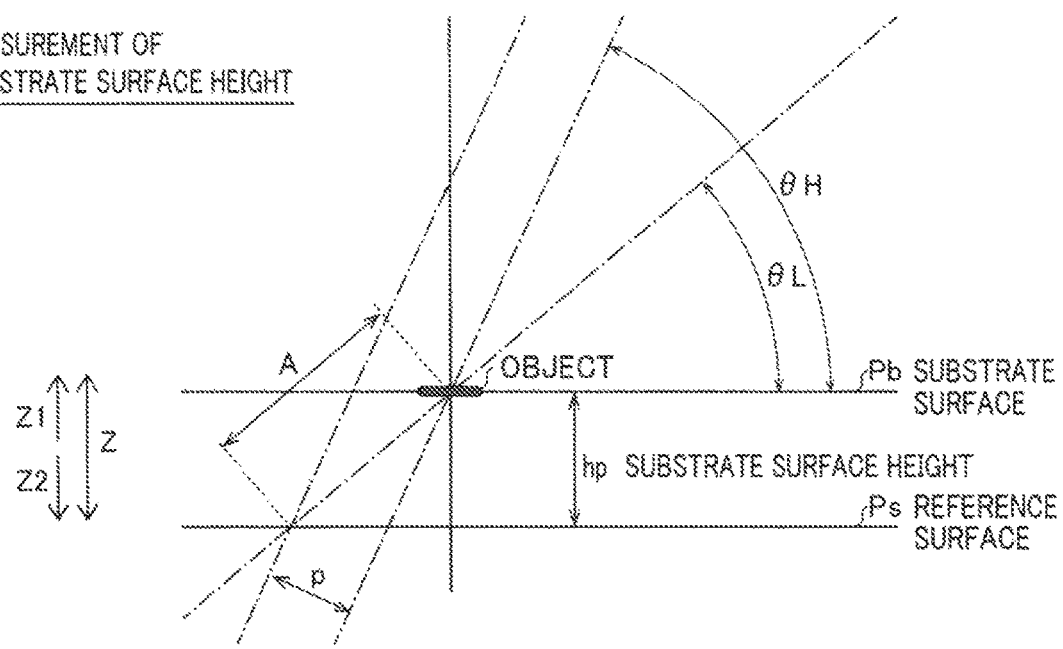
FIG. 5 is a diagram for illustrating a calculation method through stereo matching for a substrate surface height in the component mounting device according to the embodiment of the present disclosure.

Specifically, the imaging unit 8 is configured to capture images from inclination angles ($\theta H$ and $\theta L$) with different imaging directions from each other with respect to a substrate surface Pb, as shown in FIG. 5. The cameras 81 of the imaging unit 8 are disposed adjacent to each other in a vertical plane (in a YZ plane) including the mounting positions with respect to the substrate surface Pb.

The illuminators 82 are configured to emit light when the cameras 81 capture images. The illuminators 82 are provided around the cameras 81. The illuminators 82 each include a light source such as an LED (light-emitting diode).

Figure 4:
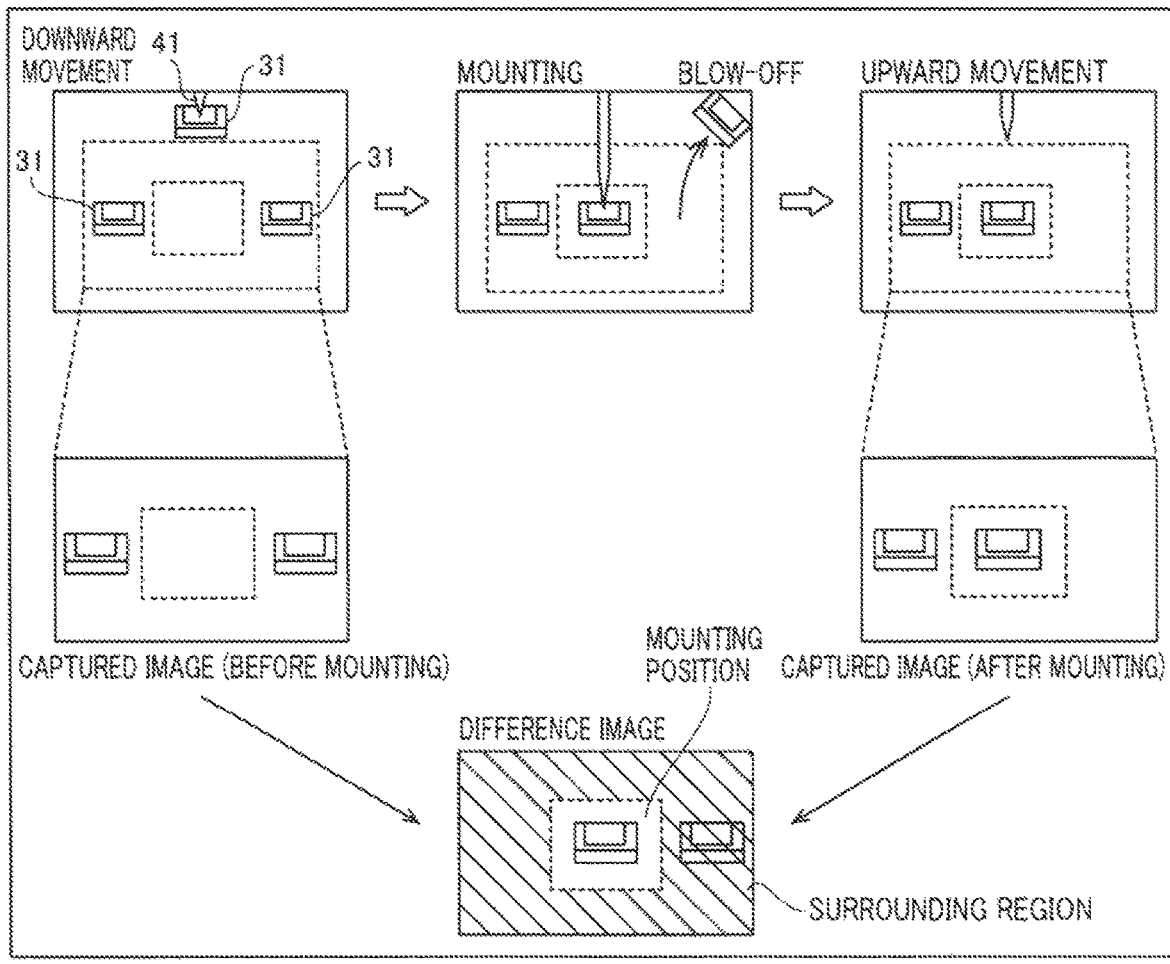
FIG. 4 is a diagram for illustrating mounting state determination based on captured images in the component mounting device according to the embodiment of the present disclosure.

As shown in FIG. 4, the imaging unit 8 is configured to image a predetermined region including a mounting position before mounting of a component 31 when a mounting head 42 suctions the component 31 and moves down toward the mounting position before mounting the suctioned component 31 at the mounting position on the substrate P. Furthermore, the imaging unit 8 is configured to image the predetermined region including the mounting position after mounting of the component 31 when the mounting head 42 moves up from the mounting position after mounting the component 31 at the mounting position on the substrate P.

The control unit 9 includes a CPU, and is configured to control the overall operation of the component mounting device 100 such as an operation of conveying the substrate P performed by the pair of conveyors 2, a mounting operation performed by the head unit 4, and imaging operations performed by the component recognition imaging portions 7, the imaging unit 8, and the substrate recognition camera 43.

According to this embodiment, the control unit 9 is configured to determine the mounting state of another component 31 mounted in advance around the mounting position based on the height information of a region around the mounting position. Furthermore, the control unit 9 is configured to determine whether or not there is a blow-off of another component 31 mounted in advance around the mounting position based on the amount of change in the image of the region around the mounting position captured before and after mounting of the component 31. Specifically, the control unit 9 is configured to determine whether or not there is a blow-off of another component 31 mounted in advance in the vicinity of the mounting position based on the amount of change in the image of the vicinity of the mounting position captured by the imaging unit 8 before and after mounting of the component 31. In addition, the control unit 9 is configured to acquire the height information of the region around the mounting position or the image of the region around the mounting position based on the imaging result of the imaging unit 8.

The control unit 9 is configured to determine whether or not there is a blow-off of another component 31 mounted in advance in the vicinity of the mounting position by comparing the image before mounting and the image after mounting. For example, the control unit 9 is configured to acquire a difference image between the image of the mounting position and the region around the mounting position before component mounting and the image of the mounting position and the region around the mounting position after component mounting and to determine whether or not there is a blow-off of another component 31 mounted in advance around the mounting position based on the difference image, as shown in FIG. 4. Specifically, when there is a blow-off, an image of the component 31 remains in a surrounding region of the difference image.

According to this embodiment, the control unit 9 is configured to acquire the height of the mounting position on the substrate P based on the images captured from the plurality of directions by the imaging unit 8. Specifically, the control unit 9 is configured to acquire the height of the substrate surface Pb of the substrate P with respect to a reference surface Ps through stereo matching, as shown in FIG. 5.

More specifically, an object (a predetermined position on the substrate surface Pb) is imaged at the inclination angle $\theta H$ by one of the cameras 81, and the object is imaged at the inclination angle $\theta L$ by the other of the cameras 81. Then, stereo matching between the captured image at the inclination angle $\theta H$ and the captured image at the inclination angle $\theta L$ is performed such that a parallax p (pixel) between the two captured images is obtained. Assuming that the camera resolution of the cameras 81 is R (μm/pixel), a distance $\underline{A}$ (μm) can be obtained from an expression (1).

$$\underline{A}=p \times R/\sin(\theta H-\theta L) \quad (1)$$

Then, the substrate surface height hp (μm) of the substrate surface Pb with respect to the reference surface Ps can be obtained from an expression (2) with the distance $\underline{A}$ obtained from the expression (1):

$$hp=A \times \sin(\theta L) \quad (2).$$

The control unit 9 is configured to acquire the height of the component 31 mounted on the substrate P and the heights of solders on the substrate P based on the images captured from the plurality of directions by the imaging unit 8. In addition, the control unit 9 is configured to determine whether or not there is a blow-off of another component 31 mounted in advance around the mounting position based on the height information of the region around the mounting position. Furthermore, the control unit 9 is configured to determine whether or not there is a blow-off of another component 31 mounted in advance around the mounting position based on the amount of change in the height information of the region around the mounting position before and after mounting of the component 31.

Figure 6:
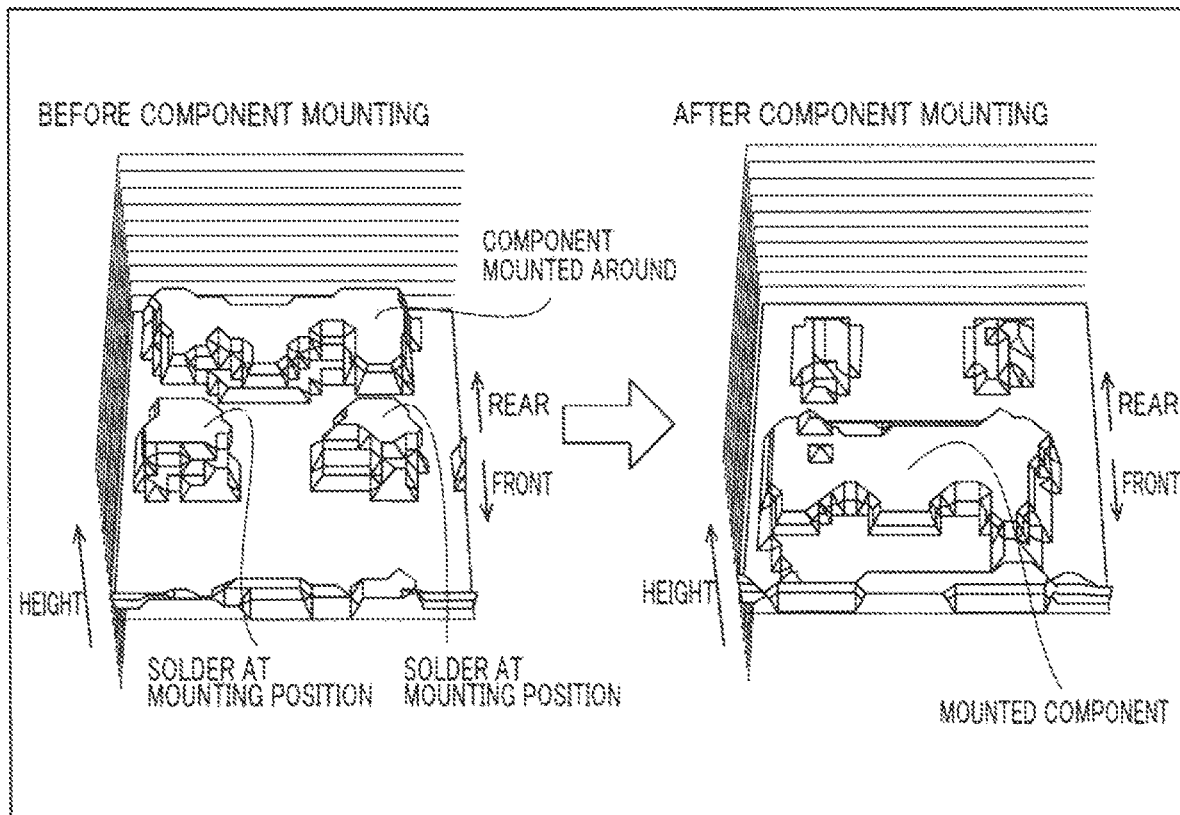
FIG. 6 is a diagram for illustrating mounting state determination based on height information in the component mounting device according to the embodiment of the present disclosure.

For example, as shown in FIG. 6, in comparison between the height information of the region around the mounting position before component mounting and the height information of the region around the mounting position after component mounting, the height of a portion corresponding to a rear component 31 is reduced if the rear component 31 is blown off when a front component 31 is mounted. That is, when the height of the region around the mounting position is reduced, the control unit 9 determines that there is a blow-off of a surrounding component 31.

(Control Processing During Mounting Operation)

Figure 7:
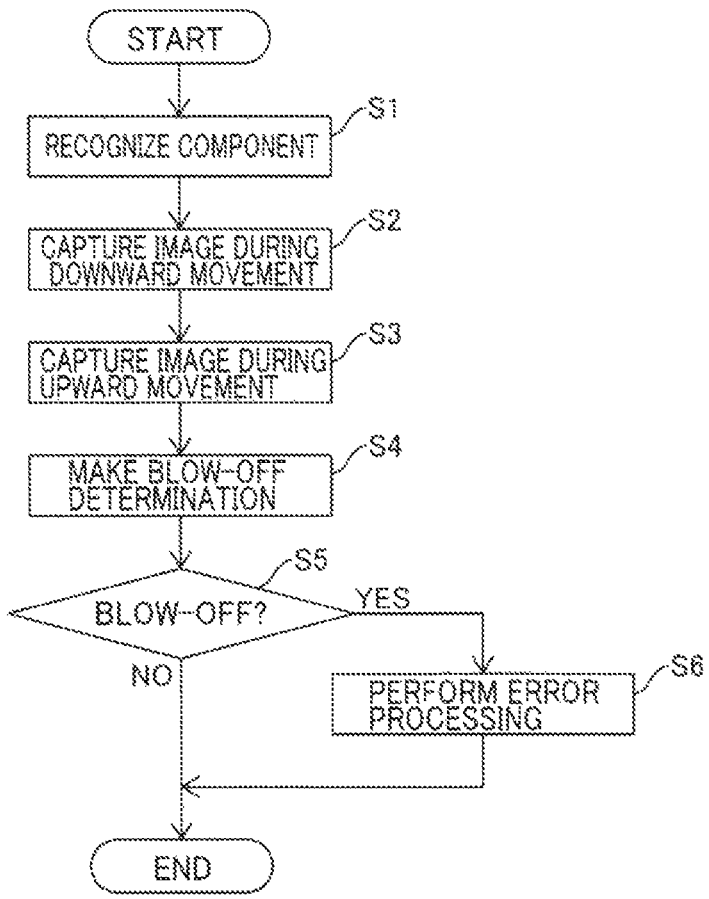
FIG. 7 is a flowchart for illustrating control processing (first operation example) during a mounting operation in the component mounting device according to the embodiment of the present disclosure.
Figure 8:
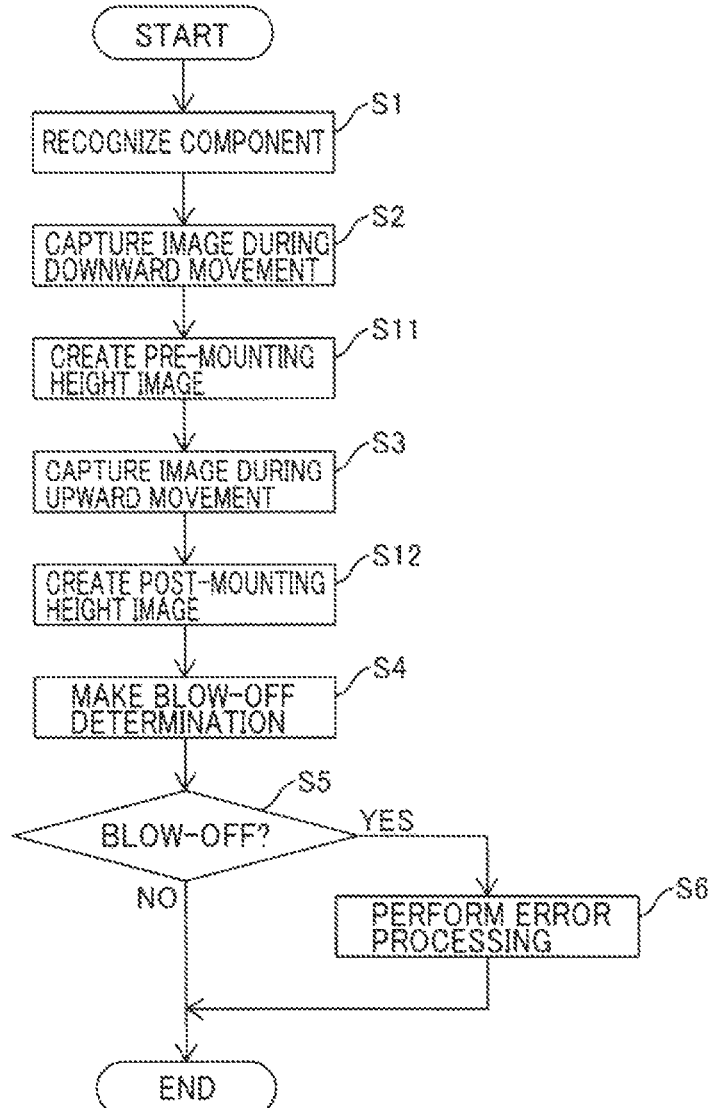
FIG. 8 is a flowchart for illustrating control processing (second operation example) during a mounting operation in the component mounting device according to the embodiment of the present disclosure.

Control processing during mounting operation performed by the control unit 9 of the component mounting device 100 is now described based on a flowchart with reference to FIGS. 7 and 8.

First, a first operation example is described with reference to FIG. 7. In step S1 in FIG. 7, the component 31 suctioned by the mounting head 42 (nozzle 41) is recognized. Specifically, the component 31 suctioned by the mounting head 42 is imaged by a component recognition imaging portion 7. Then, the component 31 is recognized based on the imaging result.

In step S2, during downward movement of the mounting head 42 (nozzle 41), the mounting position and the region around the mounting position on the substrate P are imaged by the imaging unit 8. That is, an image in which the target component 31 is not mounted at the mounting position on the substrate P is captured. Thereafter, the component 31 is mounted at the mounting position. In step S3, during upward movement of the mounting head 42 (nozzle 41), the mounting position and the region around the mounting position on the substrate P are imaged by the imaging unit 8. That is, when the component 31 is normally mounted, an image in which the target component 31 is mounted at the mounting position on the substrate P is captured.

In step S4, a blow-off determination for the component 31 around the mounting position is made. Specifically, as in an example shown in FIG. 4, the blow-off determination of the component 31 around the mounting position is made based on the difference image between an image captured during downward movement of the mounting head 42 (before component mounting operation) and an image captured during upward movement of the mounting head 42 (after the component mounting operation). In step S5, it is determined whether or not there is a blow-off. When there is a blow-off, the control unit 9 advances to step S6, and when there is no blow-off, the control unit 9 terminates the control processing during mounting operation.

In step S6, error processing is performed. For example, a user is notified of an error. Thereafter, the control processing during mounting operation is terminated.

Next, a second operation example is described with reference to FIG. 8. In step S1 in FIG. 8, the component 31 suctioned by the mounting head 42 (nozzle 41) is recognized. In step S2, during downward movement of the mounting head 42 (nozzle 41), the mounting position and the region around the mounting position on the substrate P are imaged by the imaging unit 8. That is, an image in which the target component 31 is not mounted at the mounting position on the substrate P is captured. Thereafter, the component 31 is mounted at the mounting position.

In step S11, a pre-mounting height image is created. Specifically, a height image of the mounting position and the region around the mounting position on the substrate P before component mounting operation is created through stereo matching based on the images captured from the two angles by the imaging unit 8. In step S3, during upward movement of the mounting head 42 (nozzle 41), the mounting position and the region around the mounting position on the substrate P are imaged by the imaging unit 8.

In step S12, a post-mounting height image is created. Specifically, a height image of the mounting position and the region around the mounting position on the substrate P after the component mounting operation is created through stereo matching based on the images captured from the two angles by the imaging unit 8. In step S4, a blow-off determination for the component 31 around the mounting position is made. Specifically, as in an example shown in FIG. 6, the blow-off determination of the component 31 around the mounting position is made based on the height information based on the image captured during downward movement of the mounting head 42 (before the component mounting operation) and the height information based on the image captured during upward movement of the mounting head 42 (after the component mounting operation).

In step S5, it is determined whether or not there is a blow-off. When there is a blow-off, the control unit 9 advances to step S6, and when there is no blow-off, the control unit 9 terminates the control processing during mounting operation. In step S6, error processing is performed. For example, the user is notified of an error. Thereafter, the control processing during mounting operation is terminated.

(Effects of Embodiments)

According to the embodiments, the following effects can be obtained. According to the embodiments, as hereinabove described, the component mounting device 100 includes the control unit 9 that determines the mounting state of another component 31 mounted in advance around the mounting position based on the height information of the region around the mounting position or determines whether or not there is a blow-off of another component 31 mounted in advance around the mounting position based on the amount of change in the image of the region around the mounting position captured before and after mounting of the component 31. Thus, defective mounting of another component 31 mounted in advance on the substrate P can be detected when another component 31 mounted in advance moves due to the mounting operation at the time of mounting the component 31. Consequently, unlike the case where the mounting state is determined by a downstream inspection device or the like after all the components 31 are mounted on the substrate P, defective mounting of the component 31 on the substrate P around the mounted component 31 can be immediately detected. Thus, an error can be detected immediately after defective mounting of the component 31 around the mounted component 31 occurs, and hence the cause of the defective mounting can be easily identified.

According to the embodiments, the component mounting device 100 includes the imaging unit 8 capable of imaging the region around the mounting position from the plurality of directions, and the control unit 9 is configured to acquire the height information of the region around the mounting position or the image of the region around the mounting position based on the imaging result of the imaging unit 8. Thus, when the height information of the mounting position of the component 31 is acquired based on the images captured from the plurality of directions, the positional deviation of the component 31 at the mounting position in the captured image can be accurately acquired based on the actual height information of the mounting position of the component 31. In addition, also when the image of the region around the mounting position is acquired based on the images captured from the plurality of directions, the information of the region around the mounting position in the captured image can be accurately acquired. Consequently, defective mounting of the component 31 on the substrate P around the mounted component 31 can be more accurately detected.

According to the embodiments, the imaging unit 8 includes the plurality of cameras 81. Thus, the mounting position on the substrate P can be easily imaged from the plurality of directions by the plurality of cameras 81.

According to the embodiments, the control unit 9 is configured to determine whether or not there is a blow-off of another component 31 mounted in advance in the vicinity of the mounting position based on the amount of change in the image of the vicinity of the mounting position captured by the imaging unit 8 before and after mounting of the component 31. Thus, the component 31 to be mounted and another component 31 mounted in advance in the vicinity of the mounting position can be captured in the same image, and hence a mounting determination for the component 31 and a blow-off determination for another component 31 mounted in advance in the vicinity of the mounting position can be made with the same imaging.

According to the embodiments, the imaging unit 8 is configured to capture an image before mounting of the component 31 when the mounting head 42 moves down to the mounting position on the substrate P before mounting of the component 31 and to capture an image after mounting of the component 31 when the mounting head 42 moves up from the mounting position on the substrate P after mounting of the component 31, and the control unit 9 is configured to determine whether or not there is a blow-off of another component 31 mounted in advance in the vicinity of the mounting position by comparing the image before mounting and the image after mounting. Thus, the image before mounting and the image after mounting, which are captured immediately before and after mounting, are compared, and hence it is not necessary to provide a storage unit that stores image data for the mounting positions of the plurality of components 31. Furthermore, imaging is performed during downward movement and upward movement of the mounting head 42, and hence as compared with the case where the downward/upward movement of the mounting head 42 and the imaging operation are separately performed, it is possible to prevent the time separately and additionally required for the imaging operation.

According to the embodiments, the control unit 9 is configured to determine whether or not there is a blow-off of another component 31 mounted in advance around the mounting position based on the height information of the region around the mounting position. Thus, defective mounting of the component 31 on the substrate P around the mounted component 31 can be accurately detected based on the height information of the region around the mounting position.

According to the embodiments, the control unit 9 is configured to determine whether or not there is a blow-off of another component 31 mounted in advance around the mounting position based on the amount of change in the height information of the region around the mounting position before and after mounting of the component 31. Thus, the determination is made based on the change in the height information of the region around the mounting position such that the influence of warpage of the substrate P, for example, is significantly reduced or prevented, and hence defective mounting of the component 31 on the substrate P around the mounted component 31 can be more accurately detected.

(Modifications)

The embodiments disclosed this time must be considered as illustrative in all points and not restrictive. The range of the present disclosure is shown not by the above description of the embodiments but by the scope of claims for patent, and all modifications within the meaning and range equivalent to the scope of claims for patent are further included.

Figure 9:
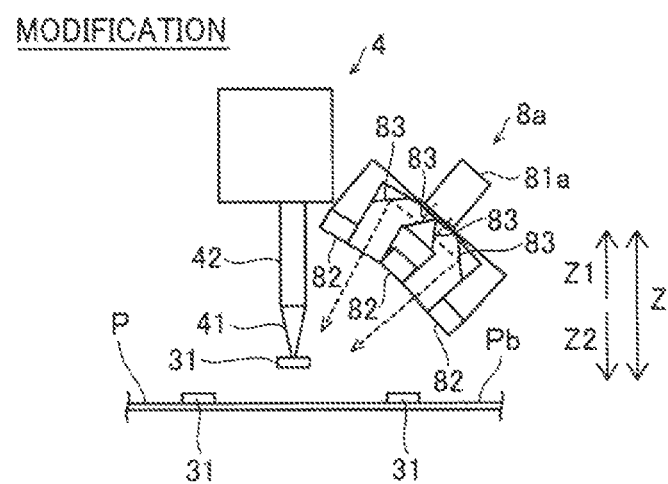
FIG. 9 is a side elevational view of a head unit of a component mounting device according to a modification of the embodiment of the present disclosure.

For example, while the example in which the imaging unit includes the plurality of cameras, and can image the mounting position from the plurality of directions has been shown in the aforementioned embodiment, the present disclosure is not restricted to this. According to the present disclosure, as in a modification shown in FIG. 9, an imaging unit 8a may include a camera 81a, illuminators 82, and optical systems 83. In this case, the field of view of the single camera 81a may be divided by the optical systems 83 including lenses and mirrors, and a mounting position may be capable of being imaged from a plurality of directions. The imaging unit 8a is an example of an "imaging portion" in the claims. Alternatively, one camera may capture an image while moving so as to image a mounting position from a plurality of directions.

While the example in which the control unit performs imaging control when the mounting head moves down to the mounting position on the substrate before mounting of the component, and performs imaging control when the mounting head moves up from the mounting position on the substrate after mounting of the component has been shown in the aforementioned embodiment, the present disclosure is not restricted to this. According to the present disclosure, the control unit may perform at least one of imaging control when the mounting head moves down to the mounting position on the substrate before mounting of the component and imaging control when the mounting head moves up from the mounting position on the substrate after mounting of the component.

While the example in which the height of the substrate at the mounting position of the component is acquired based on the imaging result of the imaging unit (imaging portion) has been shown in the aforementioned embodiment, the present disclosure is not restricted to this. According to the present disclosure, the height of the substrate at the mounting position of the component may be acquired based on a displacement sensor or a distance sensor. In this case, the displacement sensor or the distance sensor may be provided on the mounting head or in the vicinity of the mounting head.

While the example in which the control unit is configured to determine whether or not the component has been normally mounted based on the difference image between the image of the mounting position before mounting of the component and the image of the mounting position after mounting of the component has been shown in the aforementioned embodiment, the present disclosure is not restricted to this. According to the present disclosure, the image of the mounting position before mounting of the component and the image of the mounting position after mounting of the component may be correlated to each other to compare the images before and after mounting.

While the processing performed by the control unit is described, using the flow described in a manner driven by a flow in which processing is performed in order along a processing flow for the convenience of illustration in the aforementioned embodiment, the present disclosure is not restricted to this. According to the present disclosure, the processing performed by the control unit may be performed in an event-driven manner in which processing is performed on an event basis. In this case, the processing may be performed in a complete event-driven manner or in a combination of an event-driven manner and a manner driven by a flow.

What is claimed is:

1. A component mounting device comprising:
   a mounting head configured to mount a component at a mounting position on a substrate;
   an imaging unit comprising a plurality of cameras configured to image a region around the mounting position of the component from a plurality of directions; and
   a processor configured to determine a mounting state of an other component mounted in the region around the mounting position prior to mounting of the component, based on a determination whether or not a height after mounting the other component is lower than a height before mounting the other component in the region around the mounting position, by comparing the height of the other component mounted in the region around the mounting position before mounting of the component based on an imaging result from the cameras with a height of the other component mounted in the region around the mounting position after mounting of the component based on the imaging result of the cameras in a determination region including at least the entirety of the other component mounted in the region around the mounting position prior to mounting of the component, and determine a mounting state of the component at the mounting position based on a determination whether or not a height of the component after mounting based on the imaging result is higher than a height before mounting based on an imaging result at the mounting position; wherein the processor is further configured to determine whether or not there is a blow-off of the other component mounted prior to mounting of the component around the mounting position based on the height of the region around the mounting position, and also further configured to determine whether or not there is the blow-off of the other component mounted prior to mounting of the component around the mounting position based on an amount of change in the height of the region around the mounting position before and after mounting of the component, after the other component is mounted.

* * * * *